United States Patent [19]
Shiozawa

[11] Patent Number: 6,046,525
[45] Date of Patent: Apr. 4, 2000

[54] PIEZO-ELECTRIC ACTUATOR CONTROL METHOD AND DEVICE AND VARIABLE WAVELENGTH FILTER USING THE PIEZO-ELECTRIC ACTUATOR DEVICE

[75] Inventor: Takahiro Shiozawa, Tokyo, Japan

[73] Assignee: NEC Corporation, Japan

[21] Appl. No.: 08/827,303

[22] Filed: Mar. 28, 1997

[30] Foreign Application Priority Data

Mar. 28, 1996 [JP] Japan .................................. 8-074935

[51] Int. Cl.[7] .......................... G01B 11/00; H01L 41/09
[52] U.S. Cl. .................................. 310/317; 310/316.01
[58] Field of Search .................. 310/316, 317, 310/316.01

[56] References Cited

U.S. PATENT DOCUMENTS

| | | | |
|---|---|---|---|
| 5,557,156 | 9/1996 | Elings | 310/316 |
| 5,880,846 | 3/1999 | Hasman et al. | 356/376 |
| 5,912,750 | 6/1999 | Takeda et al. | 359/124 |

FOREIGN PATENT DOCUMENTS

| | | | |
|---|---|---|---|
| 60-242422 | 12/1985 | Japan | G02F 1/01 |
| 61-256774 | 11/1986 | Japan | H01L 41/08 |
| 63-283087 | 11/1988 | Japan | H01L 41/08 |
| 63-283180 | 11/1988 | Japan | H01L 41/08 |
| 64-15817 | 1/1989 | Japan | G05D 3/12 |
| 2-111273 | 4/1990 | Japan | H02N 2/00 |
| 2-287227 | 11/1990 | Japan | G01J 3/04 |
| 3-256375 | 11/1991 | Japan | H01L 41/09 |
| 4-117186 | 4/1992 | Japan | H01L 41/08 |
| 6-281813 | 10/1994 | Japan | G02B 5/28 |
| 7-198936 | 8/1995 | Japan | G02B 5/28 |
| 8-2288931 | 11/1996 | Japan | H04J 14/00 |
| 8-288932 | 11/1996 | Japan | H04J 14/00 |
| 9-68660 | 3/1997 | Japan | G02B 26/00 |
| 9-258116 | 10/1997 | Japan | G02B 26/00 |

*Primary Examiner*—Thomas M. Dougherty
*Attorney, Agent, or Firm*—Ostrolenk, Faber, Gerb & Soffen, LLP

[57] ABSTRACT

This invention provides the easy and consistent displacement control of a piezo-electric actuator for driving the variable wavelength filter used for wavelength multiplexed optical communication, wherein the piezo-electric actuator is controlled once to the initial displacement condition and, thereafter, a driving voltage is applied to the piezo-electric actuator based on the displacement characteristic data stored in a memory circuit for obtaining a desired displacement.

3 Claims, 4 Drawing Sheets

PIEZO-ELECTRIC ACTUATOR CONTROL METHOD AND DEVICE AND VARIABLE WAVELENGTH FILTER USING THE PIEZO-ELECTRIC ACTUATOR DEVICE

BACKGROUND OF THE INVENTION

1. Field of the Invention

This invention relates to a piezo-electric actuator control method and device for performing the control of a piezo-electric actuator which drives a variable wavelength filter used in a wavelength division multiplexed optical communication system.

2. Description of Related Art

Conventionally, control of a piezo-electric actuator using such piezo-electric element disclosed in, for example, Japanese Patent Application Laid-Open No. Sho 63(1988)-283180 "a piezo-electric actuator having a displacement sensor", Japanese Patent Application Laid-Open No. Hei 2(1990)-111273 "piezo-electric actuator driving device", and Japanese Patent Application Laid-Open No. Sho 63(1988)-283087 "driving method of a piezo-electric element" has been known.

In a conventional example disclosed in Japanese Patent Application Laid-Open No. Sho 63-283180, a displacement sensor is provided to a piezo-electric actuator, and the displacement sensor is used for feed back control.

In a conventional example disclosed in Japanese Patent Application Laid-Open No. Hei 2-11273, the voltage to be applied to a piezo-electric actuator is prescribed to zero, and thereafter a driving voltage is applied to the piezo-electric actuator.

Further, in a conventional example disclosed in Japanese Patent Application Laid-Open No. Sho 63-283087, the maximum voltage is applied to a piezo-electric actuator, and thereafter a driving voltage is applied to the piezo-electric actuator.

However, the conventional example disclosed in Japanese Patent Application Laid-Open No. Sho 63-283180 requires a control system comprising a displacement sensor, displacement detecting circuit, and feedback circuit, and therefore the structure is complex.

The conventional examples disclosed in Japanese Patent Application Laid-Open No. Hei 2-11273 and Japanese Patent Application Laid-Open No. Sho 63-283087 involves the adverse effect of residual hysteresis which causes inaccurate controlling of displacement position, and therefore there is room for further improvement.

SUMMARY OF THE INVENTION

It is therefore an object of the present invention to provide a piezo-electric actuator control method and device capable of controlling the displacement of a piezo-electric actuator easily and consistently which drives a variable wavelength filter in a wavelength division multiplexed optical communication system.

To achieve the above-mentioned problem, a piezo-electric actuator control method according to the present invention involves the method in which a piezo-electric actuator is controlled to the initial displacement condition, and thereafter a driving voltage based on stored displacement characteristic data is applied to the piezo-electric actuator to be controlled to a prescribed displacement.

A piezo-electric actuator displacement control device-according to the present invention comprises memory means for previously storing displacement characteristic data from a specified initial displacement condition of a piezo-electric actuator, driving means for applying a driving voltage based on an input control signal to the piezo-electric actuator for displacement, and control means for outputting control signal for applying the driving voltage based on the displacement characteristic data stored in the memory means from the driving means to the piezo-electric actuator for controlling it to a prescribed displacement.

A variable wavelength filter control method according to the present invention involves the method in which displacement of a built-in piezo-electric actuator is controlled to drive a variable wavelength filter for a wavelength division multiplexed optical communication system. The piezo-electric actuator of the variable wavelength filter is controlled to the initial displacement condition. Thereafter the variable wavelength filter is scanned while incrementing an applied voltage. Every time a wavelength multiplexed light signal is detected, the applied voltage data are stored as the control voltages for designated wavelengths, and the driving voltage based on the stored data is applied to the piezo-electric actuator to be controlled to the prescribed displacement.

A variable wavelength filter device according to the present invention comprises a built-in piezo-electric actuator, driving means for applying a control voltage to the piezo-electric actuator for displacement light detecting means for detecting a wavelength division multiplexed light signal while scanning the variable wavelength filter by changing applied control voltages to the piezo-electric actuator, memory means for storing the applied control voltage data when the light signal is detected by the light detecting means, and control means for outputting a control signal for applying the control voltage based on the data stored in the memory means to the piezo-electric actuator to be controlled to a prescribed displacement after the piezo-electric actuator is controlled to the initial displacement condition through the driving means.

DETAILED DESCRIPTION OF THE PREFERRED EMBODIMENTS

Figure 1:
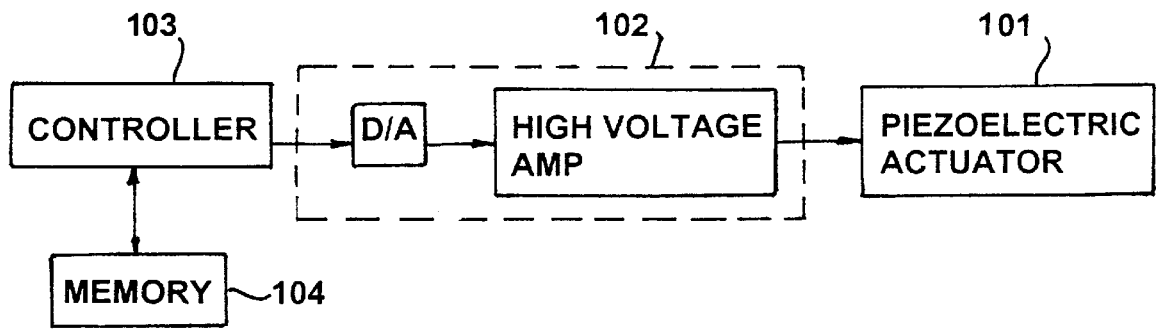
FIG. 1 is a block diagram for illustrating an embodiment of a piezo-electric actuator control device according to the present invention.

Embodiments of the piezo-electric actuator control method and device are described in detail referring to the drawings.

Referring to FIG. 1 illustrating the structure of the first embodiment of the present invention, the embodiment comprises a piezo-electric actuator 101, a driving circuit 102 having, for example, a digital/analogue (D/A) converter and a high voltage amplifier for outputting a driving voltage to displace the piezo-electric actuator 101 to a prescribed position. A control circuit 103 having a microcomputer for outputting a control signal to the driving circuit 102 to control the piezo-electric actuator 101 to the prescribed displacement. A memory circuit 104 has a semiconductor memory for storing previously determined displacement characteristic data to obtain a desired displacement from the prescribed displacement position of the piezo-electric actuator 101.

Figure 2:
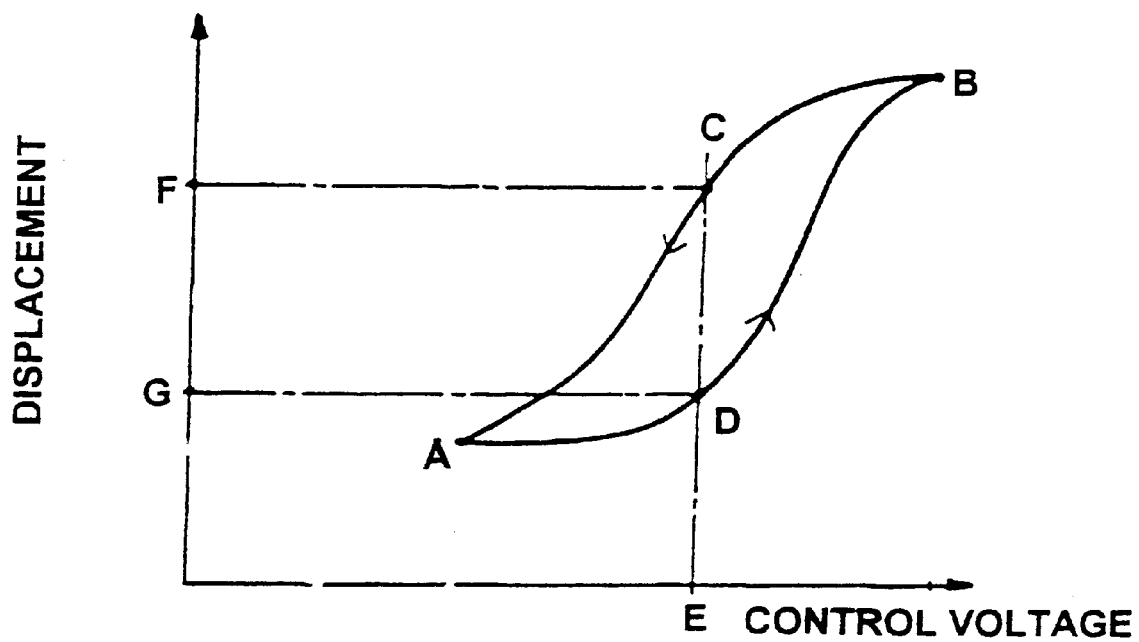
FIG. 2 is a hysteresis chart for illustrating displacement of the piezo-electric actuator in the operation of the embodiment shown in FIG. 1.

Next, operations of the first embodiment is described with reference to FIG. 2 showing a hysteresis characteristic for describing the displacement of the piezo-electric actuator 101. In FIG. 2, when a driving voltage E is applied while the piezo-electric actuator 101 is at the displacement point A, the piezo-electric actuator 101 transits to the displacement point D of the displacement G. When a driving voltage E is applied while the piezo-electric actuator 101 is at the displacement point B, the piezo-electric actuator 101 transits to the displacement point C of the displacement of F. As described herein, though the same control voltage (E) is applied to the piezo-electric actuator 101, the resultant displacement is different depending on the initial displacement condition.

In FIG. 1 and FIG. 2, first the control circuit 103 outputs a control signal for controlling the initial displacement condition of the piezo-electric actuator 101 to the driving circuit 102 for control of the piezo-electric actuator 101. The driving circuit 102 applies a driving voltage to the piezo-electric actuator 101, and controls the piezo-electric actuator 101 at the initial displacement condition. For example, the piezo-electric actuator 101 is controlled at the displacement point A. Thereafter, the control circuit 103 reads the displacement characteristics data stored in the memory circuit 104.

The control circuit 103 controls the piezo-electric actuator to a desired displacement corresponding to a displacement indication signal (not shown) based on the read displacement characteristic data. The control circuit 103 outputs a control signal for applying a driving voltage E, which displaces the piezo-electric actuator 101 to the displacement G, from the driving circuit 102 to the piezo-electric actuator 101.

Figure 3:
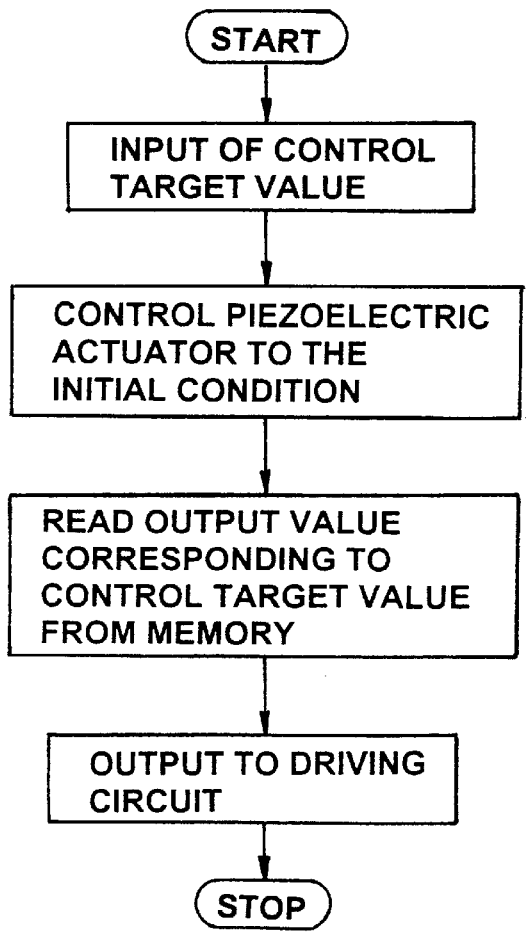
FIG. 3 is a flow chart for describing the operation sequence of the embodiment of FIG. 1.

In this case, the control circuit 103 performs the control so that the driving circuit 102 applies a driving voltage sufficiently apart from the used voltage range, to the piezo-electric actuator 101 in order to control the piezo-electric actuator 101 at the initial displacement condition. Alternately, the control circuit 103 controls the driving circuit 102 so as to apply a sine wave driving voltage to the piezo-electric actuator 101, and to reduce the amplitude gradually. Such control operations can control easily and consistently the piezo-electric actuator 101 to the prescribed displacement. FIG. 3 shows a flow chart of the corresponding control sequence.

Figure 4:
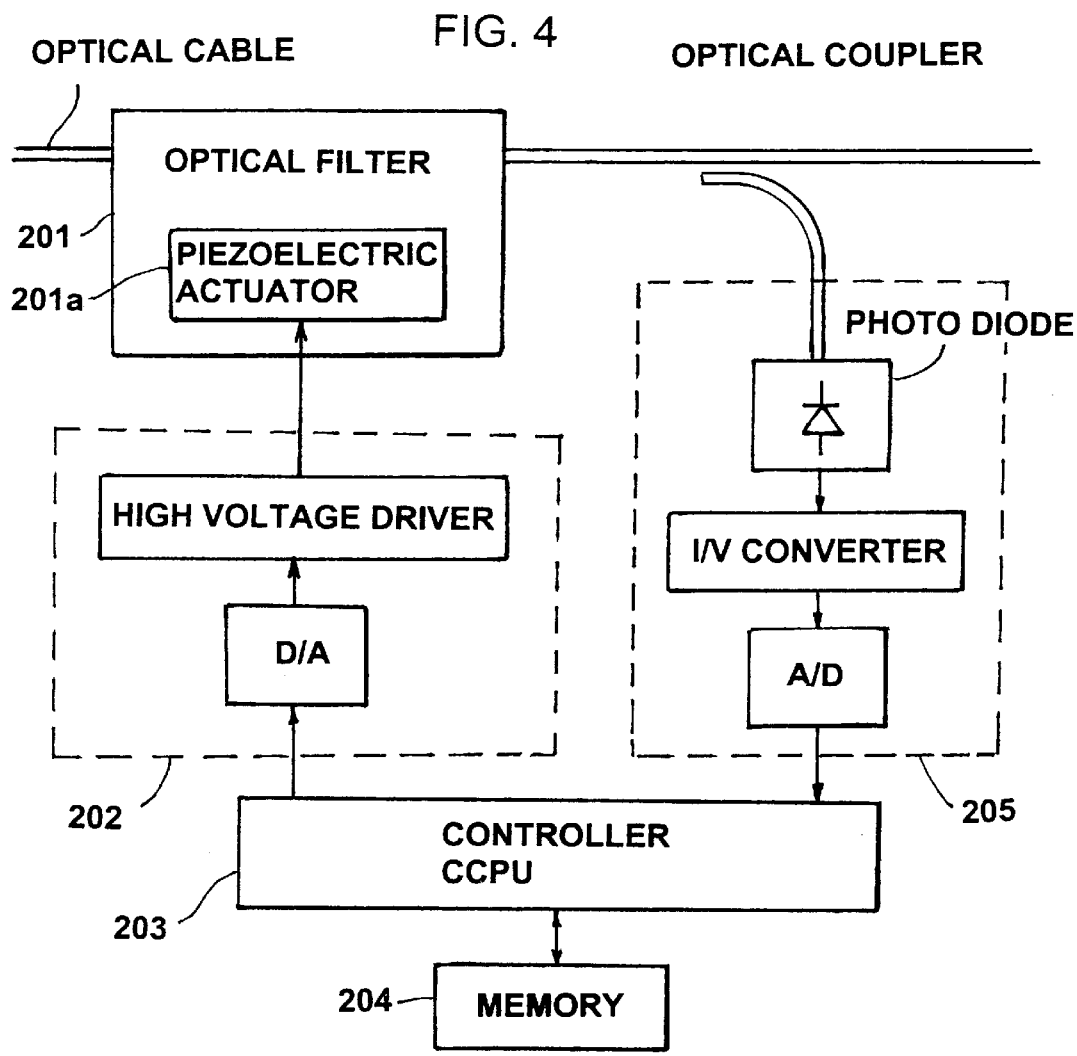
FIG. 4 is a block diagram for illustrating an embodiment of a variable wavelength filter.

FIG. 4 is a block diagram illustrating the structure of a second embodiment. The second embodiment comprises a variable wavelength filter 201, and a driving circuit 202 including a digital/analogue (D/A) converter and a high voltage amplifier for outputting a driving voltage for controlling the prescribed displacement of the piezo-electric actuator 201a contained in the variable wavelength filter 201. A control circuit 203 has a microcomputer for outputting a control signal to the driving circuit 202 to control the piezo-electric actuator 201a to the prescribed position. A memory circuit 204 has a semiconductor memory for storing a detected data from the control circuit 203. The second embodiment further comprises a light detector 205 having a photo-diode, an I/V (current/voltage) converter and an analog/digital (A/D) converter for scanning the variable wavelength filter 201 to detect a wavelength division multiplexed light signal for obtaining a transmission wavelength. For example, a filter capable of varying Fabry-Perot etalon resonance length is used as the variable wavelength filter 201. Alternately, a filter which rotates a filter of a dielectric multi-layered film or a filter which rotates a diffraction grating may be used. A mechanism for amplifying the displacement of the piezo-electric actuator or a mechanism for converting to rotation motion may be included as required.

Next, operations of the second embodiment will be described. For controlling the variable wavelength filter 201 which contains the piezo-electric actuator 201a, first the control circuit 203 outputs a control signal to the driving circuit 202, and the driving circuit 202 applies a driving voltage to drive the piezo-electric actuator 201a. Further, the piezo-electric actuator 201a is controlled at the initial displacement condition. For example, the piezo-electric actuator 201a is controlled at the displacement point A in FIG. 2. Thereafter, the variable wavelength filter 201 is scanned, and the light detector 205 detects the wavelength division multiplexed light signal while scanning. The detected data calculated through the control circuit 203 is stored in the memory circuit 204. For detecting the wavelength division multiplexed light signal, the control circuit 203 outputs a control signal to the driving circuit 202, then control of transition of displacement such as transition from the displacement point A to the displacement point D, and from displacement point D to the displacement point B in FIG. 2 is performed according to the characteristics.

Figure 5:
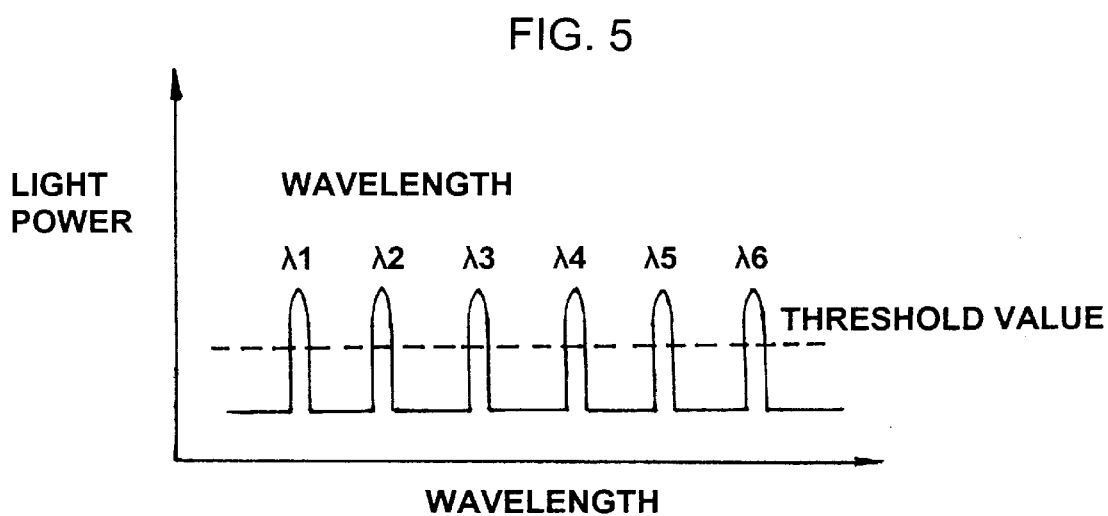
FIG. 5 is a chart for illustrating a light spectrum of a multi-wavelength optical signal shown in the embodiment of FIG. 4.

FIG. 5 is a light spectrum of a wavelength division multiplexed signal light. Because the transmission wavelength of the variable wavelength filter is a function of displacement of the piezo-electric actuator, the driving circuit 202 scans the piezo-electric actuator, thereby the transmission wavelength of the variable wavelength filter 201 is scanned, and further, the output signal from the light detector 205 is picked up according to a predetermined light spectrum waveform shown in FIG. 5. The allocation of the wavelength spectrum $\lambda_1, \lambda_2, \ldots$ is predeterminedly designated in the wavelength division multiplexed optical communication system. While scanning for example, when the taken-in light detecting signal first exceeds the previously prescribed threshold value, the control circuit 203 sends the driving voltage data (for example, E in FIG. 2) to the memory circuit 204 as the control voltage for the first wavelength $\lambda_1$, and the data is stored.

Figure 6:
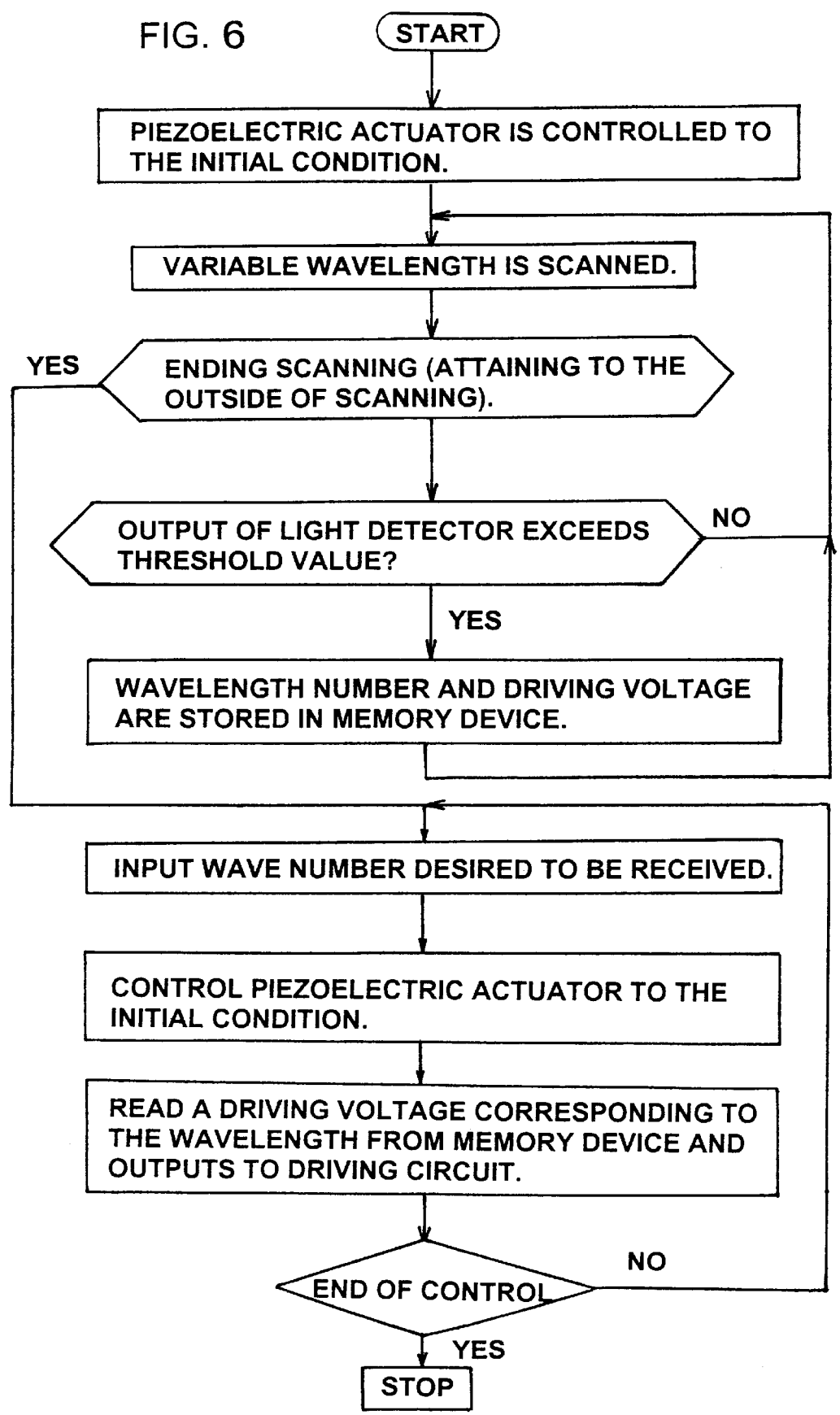
FIG. 6 is a flow chart for describing the operation sequence of the embodiment of FIG. 4.

Then, in the case that the transmission wavelength of the variable wavelength filter 201 is set to a desired wavelength (for example, the first wavelength $\lambda_1$), the control circuit 203 outputs the driving voltage data for displacing the piezo-electric actuator 201 to the displacement G in FIG. 2, and then the memory circuit 204 delivers the driving voltage data (E in FIG. 2) corresponding to the first wavelength $\lambda_1$ and outputs it to the driving circuit 202. A flow chart of the control sequence is shown in FIG. 6.

As described herein above, the piezo-electric actuator 201a, which is provided for driving the variable wavelength filter 201 in wavelength division multiplexed optical communication, is controlled easily and consistently to the prescribed displacement.

As it is obvious from the description described hereinbefore, according to the present invention, the piezo-electric actuator is controlled once to the initial displacement condition, and thereafter a driving voltage based on the stored displacement characteristic data is applied to the piezo-electric actuator to be controlled to a prescribed displacement. Therefore, the structure is simplified. Further, the adverse effect of residual hysteresis is eliminated, and the control of displacement is performed accurately. In other words, a piezo-electric actuator is controlled easily and consistently to a prescribed displacement.

Further, according to the present invention, the variable wavelength filter is controlled once to the initial displacement condition, and thereafter driving voltages associated with the predetermined desired wavelengths are detected and stored while scanning. Then, the driving voltage based on this stored data is applied to the piezo-electric actuator for controlling it to a prescribed displacement. Therefore, the variable wavelength filter in wavelength division multiplexed optical communication is controlled easily and consistently to the desired wavelengths.

What is claimed is:

1. A method of controlling a variable wavelength filter, including a built-in piezo-electric actuator, to control a passing wavelength thereof, said method comprising the acts of:

scanning the variable wavelength filter by changing an applied voltage to said piezo-electric actuator after said piezo-electric actuator is moved to an initial displacement position;

storing control data representative of said applied voltage when a light signal is detected at an output of said variable wavelength filter while said scanning is being performed;

first applying an initial driving voltage as said applied voltage to said piezo-electric actuator to set said piezo-electric actuator in said initial displacement position after said scanning; and second applying a controllable voltage as said applied voltage to said piezo-electric actuator such that said variable wavelength filter passes a desired wavelength after said first applying, said controllable voltage being determined based on said control data.

2. An optical communication system having a variable wavelength filter device including a piezo-electric actuator for controlling a passing wavelength thereof, said optical communication system comprising:

driving means for applying a driving voltage to said piezo-electric actuator to cause displacement of said variable wavelength filter;

light detecting means for detecting a light signal at an output of said variable wavelength filter;

scanning means for scanning the variable wavelength filter by controlling said driving means to increment said driving voltage after said piezo-electric actuator is controlled to an initial displacement position;

memory means for storing control data representative of said driving voltage When said light detecting means detects said light signal while said scanning means scans said variable wavelength filter; and control means for first controlling said driving means to set said piezo-electric actuator in said initial displacement condition by applying an initial driving voltage as said driving voltage, and for second controlling said piezo-electric actuator such that said variable wavelength filter passes a desired wavelength by applying a controllable voltage as said driving voltage, said controllable voltage being determined based on said control data.

3. A variable wavelength filter device according to claim 2, wherein:

said variable wavelength filter is any one of a filter which renders Fabry-Perot etalon resonance length variable, a filter which uses a rotating dielectric multi-layered film filter, and a filter which uses a rotating diffraction grating, and said light detector comprises a photo-diode and an analogue/digital converter.

* * * * *